(12) United States Patent
Chang et al.

(10) Patent No.: US 12,345,758 B2
(45) Date of Patent: Jul. 1, 2025

(54) BURN-IN SYSTEM WITH MULTIPLE PLUGS ON THE TEST BOARD

(71) Applicant: Meritech CO., Ltd., Hwaseong-si (KR)

(72) Inventors: Byung Gook Chang, Yongin-si (KR); Jong Jin Park, Hwaseong-si (KR); Seung Chul Choi, Yongin-si (KR); Seung Nam Kang, Yongin-si (KR)

(73) Assignee: Meritech CO., Ltd., Hwaseong-si (KR)

( * ) Notice: Subject to any disclaimer, the term of this patent is extended or adjusted under 35 U.S.C. 154(b) by 238 days.

(21) Appl. No.: 18/203,074

(22) Filed: May 30, 2023

(65) Prior Publication Data

US 2024/0003966 A1    Jan. 4, 2024

(30) Foreign Application Priority Data

Jul. 4, 2022 (KR) .................. 10-2022-0081927

(51) Int. Cl.
*G01R 31/28* (2006.01)

(52) U.S. Cl.
CPC ..... *G01R 31/2863* (2013.01); *G01R 31/2862* (2013.01); *G01R 31/2875* (2013.01); *G01R 31/2877* (2013.01)

(58) Field of Classification Search
CPC ............ G01R 31/2863; G01R 31/2862; G01R 1/06–07385; G01R 31/2875; G01R 31/2877

See application file for complete search history.

(56) References Cited

U.S. PATENT DOCUMENTS

| 8,272,780 B1 | 9/2012 | Wilkins |
| 9,759,741 B2 * | 9/2017 | Park .................. G01R 1/0408 |
| 2023/0408576 A1 * | 12/2023 | Kim .................. G01R 31/2863 |

FOREIGN PATENT DOCUMENTS

| CN | 102053220 A | 5/2011 | |
| KR | 10-0561951 B1 | 3/2006 | |
| KR | 10-2008-0051762 A | 6/2008 | |
| KR | 101974788 B1 * | 9/2019 | ......... G01R 31/2862 |
| KR | 10-2022-0041684 A | 4/2022 | |

* cited by examiner

*Primary Examiner* — Lee E Rodak
*Assistant Examiner* — Taqi R Nasir
(74) *Attorney, Agent, or Firm* — Revolution IP, PLLC

(57) ABSTRACT

Disclosed herein is a burn-in system with a plurality of plugs on test boards, including: a main body (100) which has a test chamber (200) with an open front side; a plurality of test boards (40) on which a plurality of semiconductor chips (90) are mounted and which is mounted in the test chamber (200); a main board which tests the semiconductor chips by exchanging signals with the plurality of semiconductor chips; a door (540) which is provided on the main body (100) to open and close the test chamber (200); and a temperature control means provided inside the main body (100) to heat and cool the test boards (40) mounted inside the test chamber (200).

7 Claims, 6 Drawing Sheets

BURN-IN SYSTEM WITH MULTIPLE PLUGS ON THE TEST BOARD

BACKGROUND OF THE INVENTION

Field of the Invention

The present invention relates to a burn-in system, and more specifically, to a burn-in test apparatus with a new structure, which includes a plurality of plugs to test semiconductor chips simultaneously.

Background Art

In general, a burn-in test apparatus used for heat resistance tests of semiconductor chips, as illustrated in FIG. 1, includes: a main body 1 in which a test chamber 2 with an open front is formed; a plurality of test boards 3 on which a plurality of semiconductor chips 8 are mounted and which are installed in the test chamber 2; a door 5 installed on the main body 1 to open and close the test chamber 2; and a temperature control means installed inside the main body 1 to heat and cool the test boards 3 installed inside the test chamber 2.

Additionally, a plurality of sockets 6 to which the test boards 3 are connected are provided on the inner front surface of the test chamber 2 in a vertical direction.

Moreover, each of the test boards 3 is formed in a rectangular plate shape, and has a plug 7 provided at the front end portion to be coupled to the socket 6, and the semiconductor chips 8 are electrically connected to the plugs 7 by circuit patterns formed on the test board 3.

Therefore, in a state in which the plurality of test boards 3 are mounted to be connected to the sockets (13) provided in the test chamber 1 and the door 5 is closed, the temperature control means is operated according to a pre-set pattern to heat or cool semiconductors mounted on the test board 3, and a main board 9 connected to the socket 6 monitors the operation state of the semiconductor chips 8 mounted on the test board 3, thus enabling the heat resistance test of the plurality of semiconductor chips 8 simultaneously.

However, because recently developed semiconductor chips 8 are becoming more advanced, lists of items which need to be measured are diversified and increased. So, there is a problem in that work efficiency is reduced since it takes much time to perform tests using main boards which are installed in correspondence to the test boards one to one.

PATENT LITERATURE

Patent Documents

Patent Document 1: Korean Patent No. 10-0561951
Patent Document 2: Korean Patent Publication No. 10-2008-0051762
Patent Document 3: Korean Patent No. 10-1974788

SUMMARY OF THE INVENTION

Accordingly, the present invention has been made to solve the above-mentioned problems occurring in the prior arts, and it is an object of the present invention to provide a burn-in test apparatus with a new structure, which is formed to easily attach or detach test boards on which a plurality of semiconductor chips are mounted.

It is another object of the present invention to provide a burn-in test apparatus with a new structure which includes a plurality of plugs on the test boards to test the semiconductor chips simultaneously.

It is a further object of the present invention to provide a burn-in test apparatus with a new structure, in which main boards are installed on three or four sides of a test chamber to correspond to the plurality of test boards mounted in a test chamber.

Objects of the present invention are not limited to the objects described above, and other objects that are not described will be clearly understood by a person skilled in the art from the description below.

To accomplish the above object, according to the present invention, there is provided a burn-in system with a plurality of plugs on a test board including: a main body which has a test chamber with an open front side; a plurality of test boards on which a plurality of semiconductor chips are mounted and which is mounted in the test chamber; a main board which tests the semiconductor chips by exchanging signals with the plurality of semiconductor chips; a door which is provided on the main body to open and close the test chamber; and a temperature control means provided inside the main body to heat and cool the test boards mounted inside the test chamber, wherein the plug of the test board and the socket of the main board are connected to each other to send and receive information, and wherein the test board is formed in a rectangular shape and has four sides, in a case in which the side opposite the door is referred to as a front side and the side closest to the door is referred to as a rear side when the test board is mounted in the test chamber, and in a case in which the side located on the left is referred to as a left side and the side located on the right is referred to as a right side when looking from the back to the front, the plugs provided on the test board are installed on at least two sides.

Moreover, the plugs are composed of a first plug installed on the front side of the test board, a second plug installed on the left side, and a third plug installed on the right side. The sockets respectively connected to the plugs are arranged to correspond to each plug, and consist of a first socket connected to the first plug, a second socket connected to the second plug, and a third socket connected to the third plug.

Furthermore, the first socket is connected to a first main board that tests a portion of the semiconductor chips inserted into the test board, the second socket is connected to a second main board that tests another portion of the semiconductor chips inserted into the test board, the third socket is connected to a third main board that tests another portion of the semiconductor chips inserted into the test board, and each socket is equipped with each main board.

Additionally, the test chamber has three side walls provided therein: a first wall located opposite the door; and a second wall located at the left side and a third wall located at the right side when looking at the first wall from a position where the door closes, wherein the first socket and the first main board are positioned on the first wall, the second socket and the second main board are positioned on the second wall, and the third socket and the third main board are positioned on the third wall.

In addition, a fourth plug is installed on the rear side of the test board, a fourth socket corresponding to the fourth plug is provided, the fourth socket is connected to the fourth main board, and the fourth main board is installed on the inner surface of the door.

Moreover, in a case in which a vertex located on the left of the front side of the test board is defined as a first left end point, a vertex located on the right of the front side is defined as a first right end point, a vertex located on the left of the rear side of the test board is defined as a fourth left end point, a vertex located on the right of the rear side is defined as a fourth right end point, a line connecting the first left end point and the fourth right end point is referred to as a first virtual line, a line connecting the first right end point and the fourth left end point is referred to as a second virtual line, a point where the first virtual line and the second virtual line intersect is called a center point, and a virtual line connecting the center point and a center point of the rear side is defined as a third virtual line, and in a case in which an area surrounded by the front side, the first virtual line, the center point, and the second virtual line is referred to as a first zone, an area surrounded by the left side, the first virtual line, the center point, and the fourth virtual line is referred to as a second zone, and an area surrounded by the right side, the second virtual line, the center point, and the fourth virtual line is defined as a third zone, the plurality of semiconductor chips mounted in the first zone are tested by the first main board, the plurality of semiconductor chips mounted in the second zone are tested by the second main board, and the plurality of semiconductor chips mounted in the third zone are tested by the third main board.

Furthermore, in a case in which a vertex located on the left of the front side of the test board is defined as a first left end point, a vertex located on the right of the front side is defined as a first right end point, a vertex located on the left of the rear side of the test board is defined as a fourth left end point, and a vertex located on the right of the rear side is defined as a fourth right end point, a line connecting the first left end point and the fourth right end point is referred to as a first virtual line, a line connecting the first right end point and the fourth left end point is referred to as a second virtual line, a point where the first virtual line and the second virtual line intersect may be defined as a center point, and in a case in which an area surrounded by the front side, the first virtual line, the center point, and the second virtual line is referred to as a first zone, an area surrounded by the left side, the first virtual line, the center point, and the second virtual line is referred to as a second zone, an area surrounded by the right side, the first virtual line, the center point, and the second virtual line is defined as a third zone, and an area surrounded by the back side, the first virtual line, the center point, and the second virtual line is defined as a fourth zone, the plurality of semiconductor chips mounted in the first zone are tested on the first main board, the plurality of semiconductor chips mounted in the second zone are tested on the second main board, the plurality of semiconductor chips mounted in the third zone are tested on the third main board, and the plurality of semiconductor chips mounted in the fourth zone are tested on the fourth main board.

In addition, the second socket and the second main board arranged on the second wall surface are arranged to be movable, and the third socket and the third main board arranged on the third wall surface are arranged to be movable. When the test board is put into the test chamber, the second socket and the third socket move towards the test board, so the second socket docks with the second plug and the third socket docks with the third plug.

The burn-in test apparatus according to the present invention includes the plurality of plugs on the plurality of test boards, and the main boards installed on three or four sides of the test chamber to correspond to the plurality of test boards mounted in the test chamber such that burn-in tests for the plurality of test boards are performed simultaneously, thereby reducing processing time and enhancing work efficiency.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
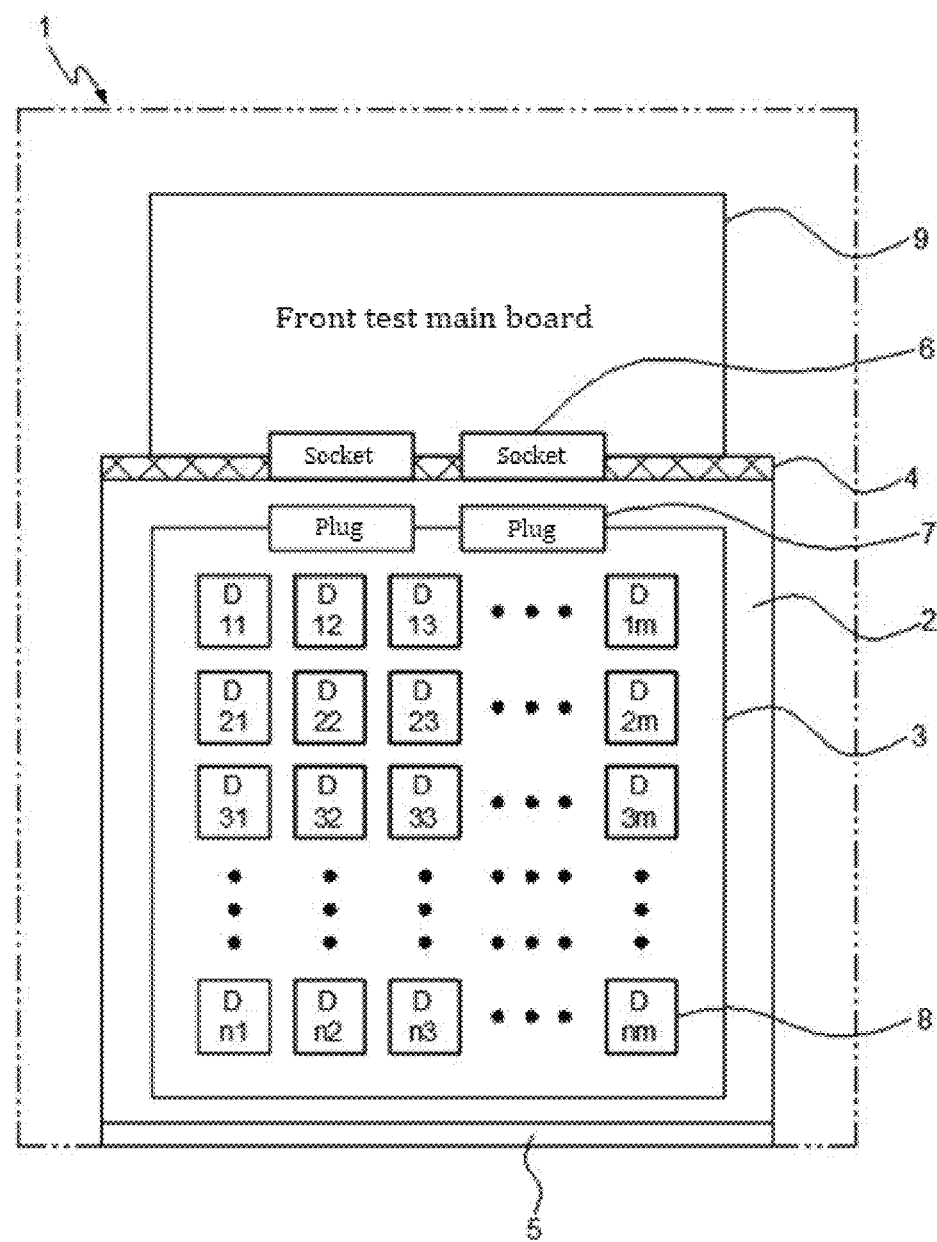
FIG. 1 is a plan view schematically illustrating a conventional burn-in test system.

Hereinafter, preferred embodiments of the present invention will be described in detail with reference to the accompanying drawings. In the drawings, thicknesses of lines and sizes of constituent elements may be exaggerated for clarity and convenience in explanation.

Furthermore, wordings to be described later are defined in consideration of the functions of the present invention, and may differ depending on the intentions of a user or an operator or custom. Accordingly, such wordings should be defined on the basis of the contents of the overall specification.

In addition, the embodiment disclosed hereinafter does not limit the scope of the present invention, but corresponds to merely exemplary terms of constituent elements presented in claims of the present invention, and the embodiments that include replaceable constituent elements as equivalents of the constituent elements defined in the overall specification and claims may be included in the scope of the present invention.

Figure 2:
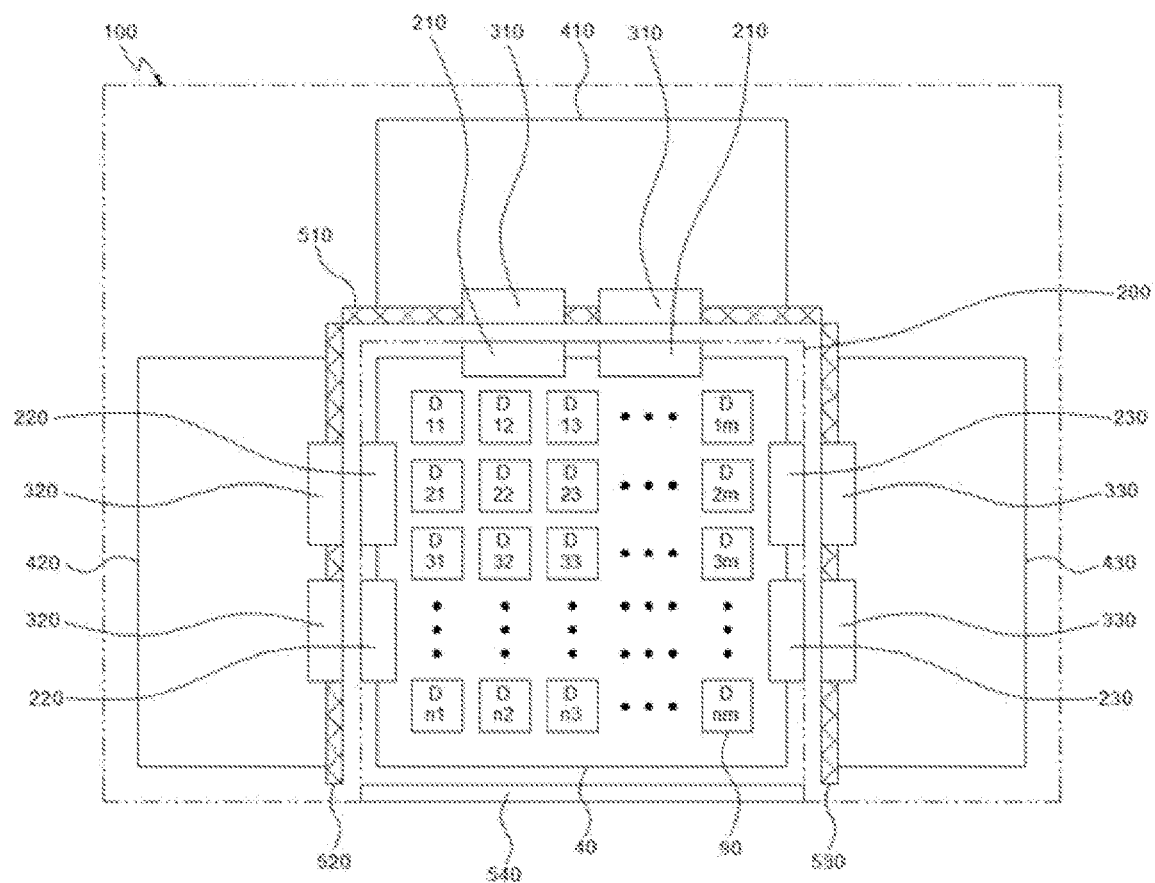
FIG. 2 is a plan view schematically illustrating a burn-in system according to a preferred embodiment of the present invention.
Figure 3:
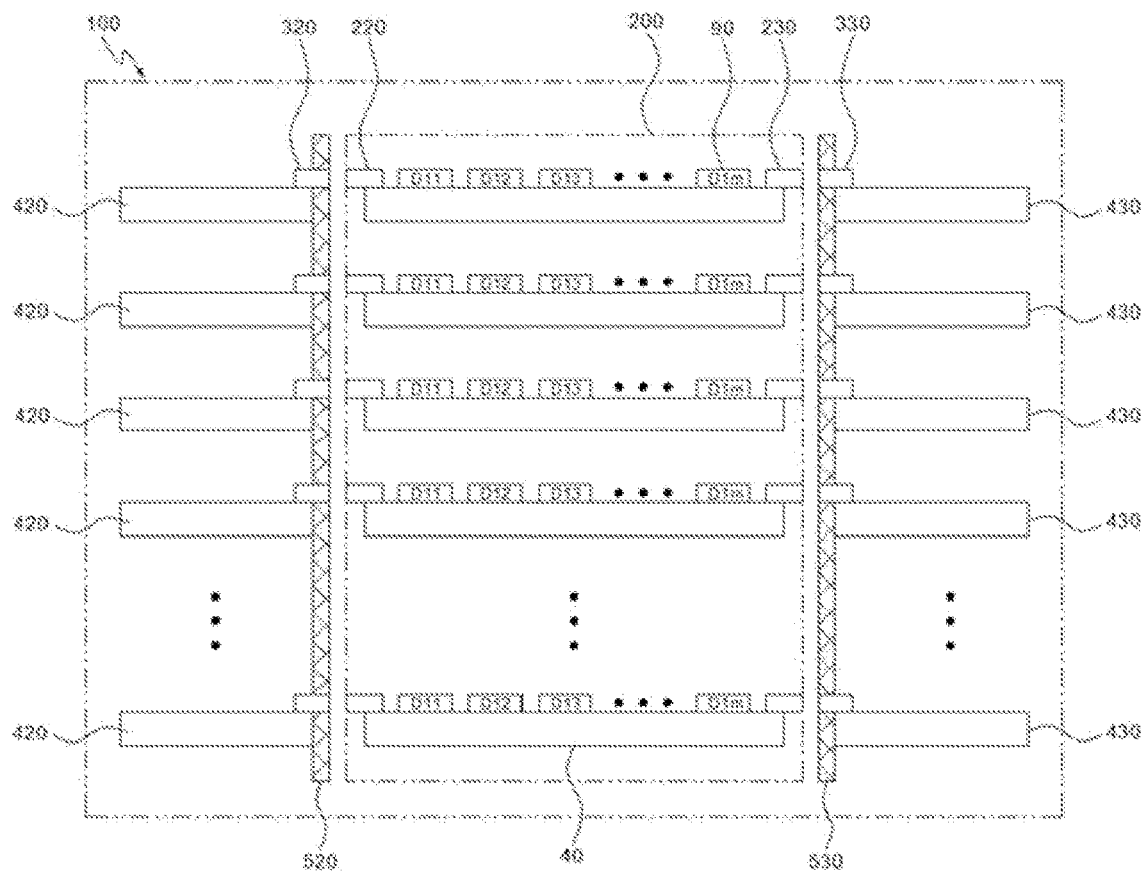
FIG. 3 is a front view schematically illustrating a burn-in system according to a preferred embodiment of the present invention.
Figure 4:
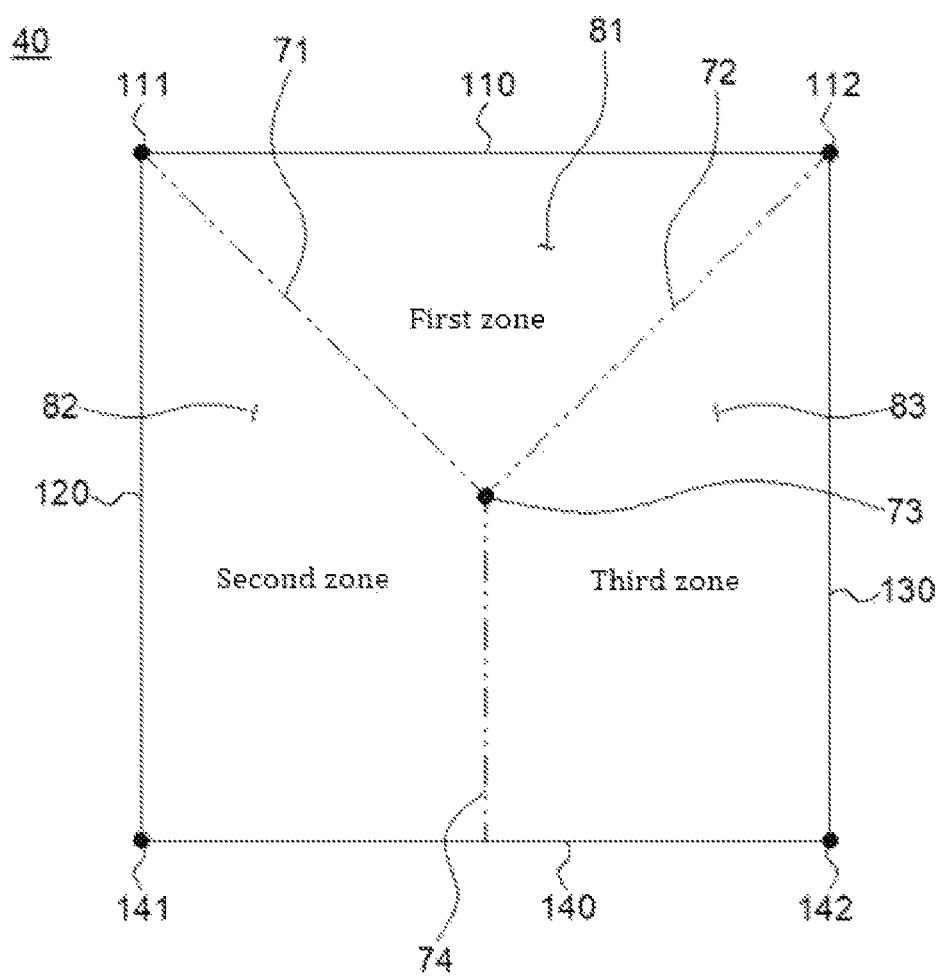
FIG. 4 is a plan view schematically illustrating a test board according to a preferred embodiment of the present invention.
Figure 5:
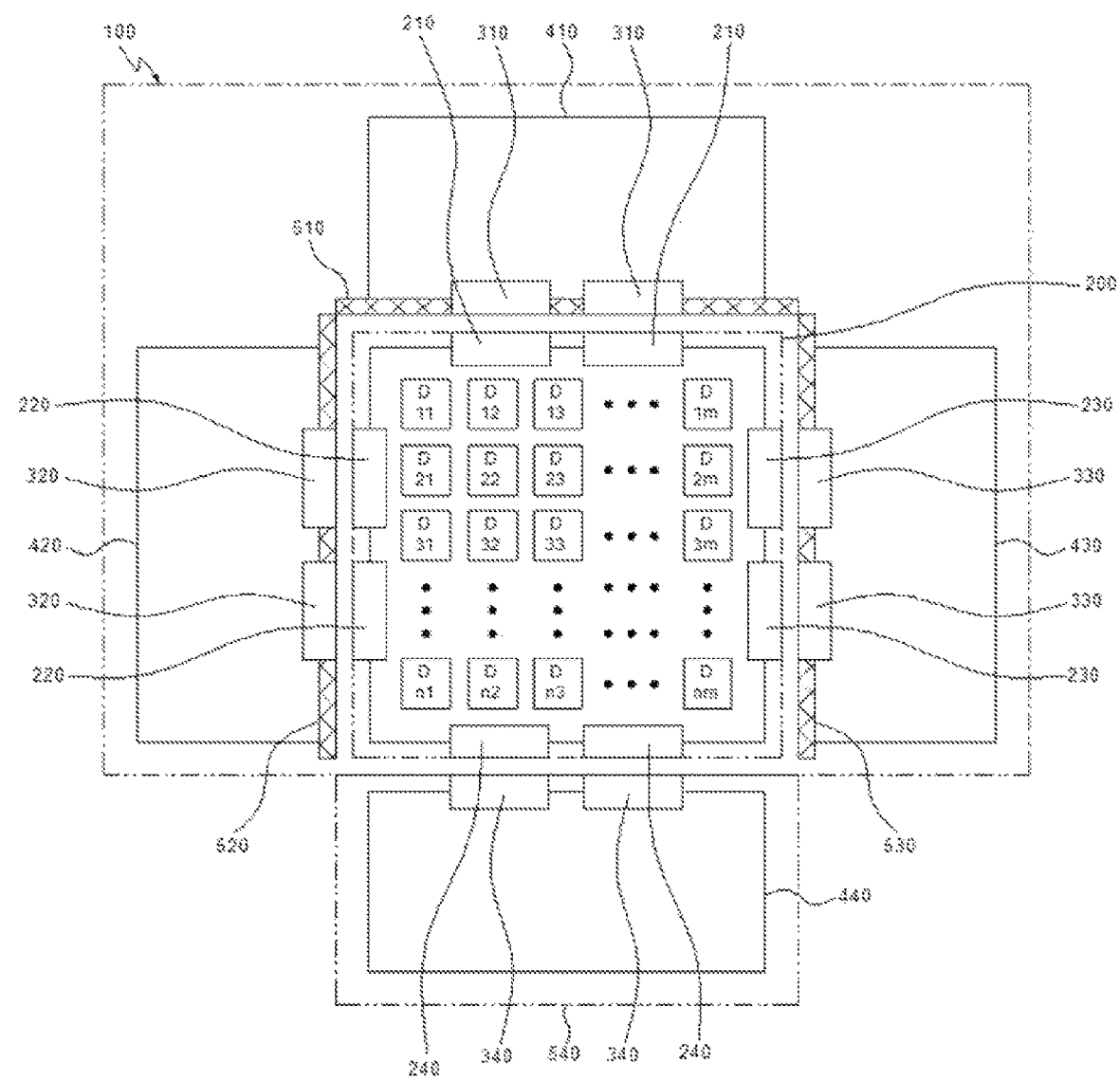
FIG. 5 is a plan view schematically illustrating a burn-in system according to another embodiment of the present invention.
Figure 6:
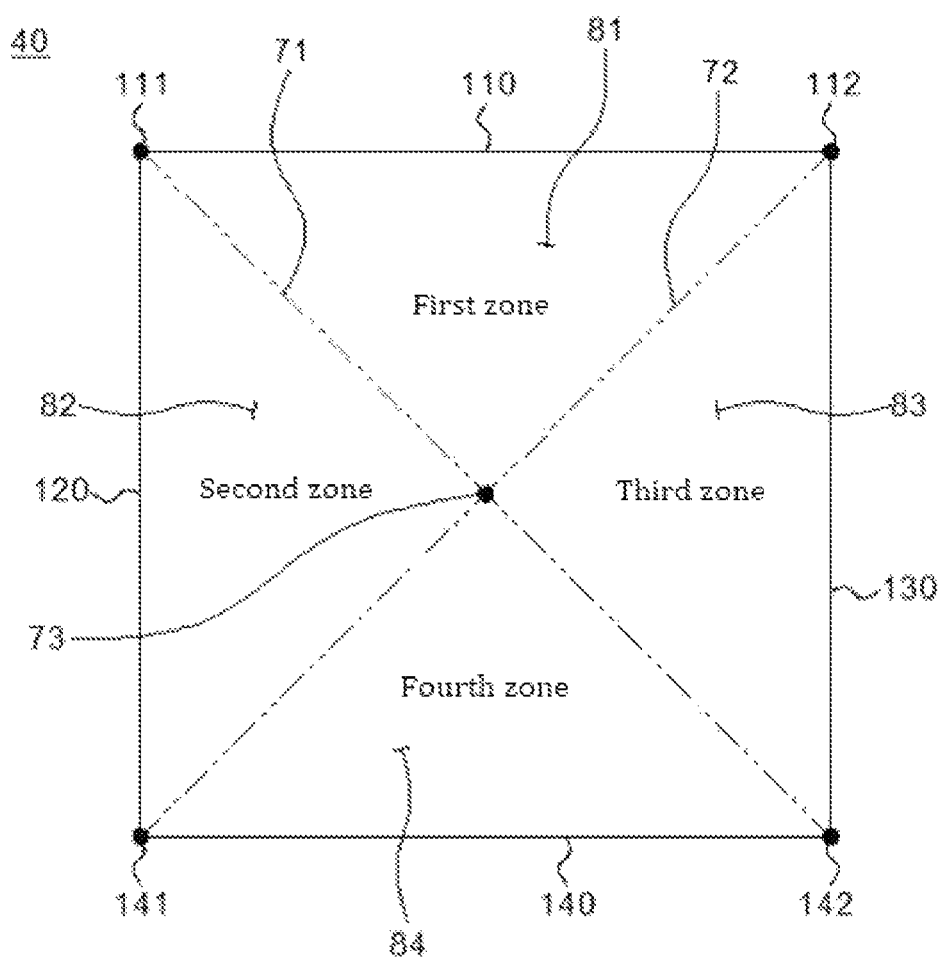
FIG. 6 is a plan view schematically illustrating a test board according to another embodiment of the present invention.

FIG. 2 is a plan view schematically illustrating a burn-in system according to a preferred embodiment of the present invention, FIG. 3 is a front view schematically illustrating a burn-in system according to a preferred embodiment of the present invention, FIG. 4 is a plan view schematically illustrating a test board according to a preferred embodiment of the present invention, FIG. 5 is a plan view schematically illustrating a burn-in system according to another embodiment of the present invention, and FIG. 6 is a plan view schematically illustrating a test board according to another embodiment of the present invention.

As illustrated in FIGS. 2 to 6, a burn-in test apparatus according to the present invention includes: a main body 100 which has a test chamber 200 with an open front side; a plurality of test boards 40 on which a plurality of semiconductor chips 90 are mounted and which is mounted in the test chamber 200; a main board which tests the semiconductor chips by exchanging signals with the plurality of semiconductor chips; a door 540 which is provided on the main body 100 to open and close the test chamber 200; and a temperature control means provided inside the main body 100 to heat and cool the test boards 40 mounted inside the test chamber 200.

Moreover, the temperature control means includes a cooling unit and a heater which are installed inside the main body 100.

Furthermore, the temperature control means is equipped in a duct connected to the test chamber 200 to supply air heated at high temperature or cooled at low temperature to the test chamber 200 through the duct, thereby heating or cooling the test boards 20 and the semiconductor chips 90 mounted inside the test chamber 200.

Meanwhile, referring to FIGS. 2 to 4, the test board 40 is formed in a rectangular shape and has four sides. When the test board 40 is mounted in the test chamber, the side opposite the door is referred to as a front side 110, the side closest to the door is referred to as a rear side 140. When looking from the back to the front, the side located on the left is referred to as a left side 120, and the side located on the right is referred to as a right side 130. The plugs provided on the test board are installed on at least two sides.

Moreover, the plugs are composed of a first plug 210 installed on the front side 110 of the test board 40, a second plug 220 installed on the left side 120, and a third plug 230 installed on the right side 130.

Additionally, the sockets respectively connected to the plugs are arranged to correspond to each plug, and consist of a first socket 310 connected to the first plug 210, a second socket 320 connected to the second plug 220, and a third socket 330 connected to the third plug 230.

Furthermore, the first socket 310 is connected to a first main board 410 that tests a portion of the semiconductor chips inserted into the test board 40, and the second socket 320 is connected to a second main board 420 that tests another portion of the semiconductor chips inserted into the test board 40.

Moreover, the third socket 330 is connected to a third main board 430 that tests another portion of the semiconductor chips inserted into the test board. Therefore, each socket is equipped with each main board.

Additionally, the test chamber 200 has three side walls provided therein, and the three side walls are composed of a first wall 510 located opposite the door 540, a second wall 520 located at the left side and a third wall 530 located at the right side when looking at the first wall 510 from a position where the door 540 closes.

In addition, the first socket 310 and the first main board 410 are positioned on the first wall 510, the second socket 320 and the second main board 420 are positioned on the second wall 520, and the third socket 330 and the third main board 430 are positioned on the third wall 530.

Referring to FIG. 4, a vertex located on the left of the front side 110 of the test board 40 is defined as a first left end point 111, and a vertex located on the right of the front side 110 is defined as a first right end point 112.

Moreover, a vertex located on the left of the rear side 140 of the test board 40 is defined as a fourth left end point 141, and a vertex located on the right of the rear side 140 is defined as a fourth right end point 142.

Furthermore, a line connecting the first left end point 111 and the fourth right end point 142 is referred to as a first virtual line 71, and a line connecting the first right end point 112 and the fourth left end point 141 is referred to as a second virtual line 72. A point where the first virtual line 71 and the second virtual line 72 intersect is called a center point 73, and a virtual line connecting the center point 73 and a center point of the rear side 140 is defined as a third virtual line 74.

Furthermore, an area surrounded by the front side 110, the first virtual line 71, the center point 73, and the second virtual line 72 is referred to as a first zone 81. An area surrounded by the left side 120, the first virtual line 71, the center point 73, and the fourth virtual line 74 is referred to as a second zone 82. An area surrounded by the right side 130, the second virtual line 72, the center point 73, and the fourth virtual line 74 is defined as a third zone 83.

At this time, the plurality of semiconductor chips mounted in the first zone 81 are tested by the first main board 410, the plurality of semiconductor chips mounted in the second zone 82 are tested by the second main board 420, and the plurality of semiconductor chips mounted in the third zone 83 are tested by the third main board 430.

Therefore, the invention performs burn-in tests simultaneously in the first to third zones of the test boards 40 by installing the three main boards 410, 420 and 430 corresponding to the plurality of test boards mounted in the test chamber, thereby improving the testing speed and accuracy.

Meanwhile, the second socket 320 and the second main board 420 arranged on the second wall surface 520 are arranged to be movable, and the third socket 330 and the third main board 430 arranged on the third wall surface 530 are arranged to be movable.

Accordingly, when the test board 40 is put into the test chamber 200, the second socket 320 and the third socket 330 move towards the test board, so the second socket 320 docks with the second plug 220 and the third socket 330 docks with the third plug 230.

Referring to FIGS. 5 and 6, a fourth plug 240 is installed on the rear side 140 of the test board 40, and a fourth socket 340 corresponding to the fourth plug 240 is provided. The fourth socket 340 is connected to the fourth main board 440, and the fourth main board 440 may be installed on the inner surface of the door 540.

Additionally, a vertex located on the left of the front side 110 of the test board 40 is defined as a first left end point 111, and a vertex located on the right of the front side 110 is defined as a first right end point 112. A vertex located on the left of the rear side 140 of the test board 40 is defined as a fourth left end point 141, and a vertex located on the right of the rear side 140 is defined as a fourth right end point 142.

Furthermore, a line connecting the first left end point 111 and the fourth right end point 142 is referred to as a first virtual line 71, and a line connecting the first right end point 112 and the fourth left end point 141 is referred to as a second virtual line 72. A point where the first virtual line 71 and the second virtual line 72 intersect may be defined as a center point 73.

Additionally, an area surrounded by the front side 110, the first virtual line 71, the center point 73, and the second virtual line 72 is referred to as a first zone 81. An area surrounded by the left side 120, the first virtual line 71, the center point 73, and the second virtual line 72 is referred to as a second zone 82. An area surrounded by the right side 130, the first virtual line 71, the center point 73, and the second virtual line 72 is defined as a third zone 83. An area surrounded by the back side 140, the first virtual line 71, the center point 73, and the second virtual line 72 is defined as a fourth zone 84.

At this time, the plurality of semiconductor chips mounted in the first zone 81 are tested on the first main board 410, the plurality of semiconductor chips mounted in the second zone 82 are tested on the second main board 420, the plurality of semiconductor chips mounted in the third zone 83 are tested on the third main board 430, and the plurality of semiconductor chips mounted in the fourth zone 84 are tested on the fourth main board 440.

Therefore, the invention performs burn-in tests simultaneously in the first to fourth zones of the test boards 40 by installing the four main boards 410, 420, 430 and 440 corresponding to the plurality of test boards mounted in the test chamber, thereby improving the testing speed and accuracy.

Although exemplary embodiments of the present invention have been described in detail, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A burn-in system with a plurality of plugs on test boards, comprising:
a main body which has a test chamber with an open front side; a plurality of test boards on which a plurality of semiconductor chips are mounted and which is mounted in the test chamber; a main board which tests the semiconductor chips by exchanging signals with the plurality of semiconductor chips; a door which is provided on the main body to open and close the test chamber; and a temperature control means provided inside the main body to heat and cool the test boards mounted inside the test chamber,
wherein the plug of the test board and the socket of the main board are connected to each other to send and receive information,
wherein the test board is formed in a rectangular shape and has four sides, in a case in which the side opposite the door is referred to as a front side and the side closest to the door is referred to as a rear side when the test board is mounted in the test chamber, and in a case in which the side located on the left is referred to as a left side and the side located on the right is referred to as a right side when looking from the back to the front, the plugs provided on the test board are installed on at least two sides, and
wherein the plugs are composed of a first plug installed on the front side of the test board, a second plug installed on the left side, and a third plug installed on the right side, and
wherein the sockets respectively connected to the plugs are arranged to correspond to each plug, and consist of a first socket connected to the first plug, a second socket connected to the second plug, and a third socket connected to the third plug.

2. The burn-in system according to claim 1, wherein the first socket is connected to a first main board that tests a portion of the semiconductor chips inserted into the test board,
wherein the second socket is connected to a second main board that tests another portion of the semiconductor chips inserted into the test board,
wherein the third socket is connected to a third main board that tests another portion of the semiconductor chips inserted into the test board, and
wherein each socket is equipped with each main board.

3. The burn-in system according to claim 2, wherein the test chamber has three side walls provided therein:
a first wall located opposite the door; and
a second wall located at the left side and a third wall located at the right side when looking at the first wall from a position where the door closes,
wherein the first socket and the first main board are positioned on the first wall, the second socket and the second main board are positioned on the second wall, and the third socket and the third main board are positioned on the third wall.

4. The burn-in system according to claim 3, wherein a fourth plug is installed on the rear side of the test board,
wherein a fourth socket corresponding to the fourth plug is provided,
wherein the fourth socket is connected to the fourth main board, and
wherein the fourth main board is installed on the inner surface of the door.

5. The burn-in system according to claim 3, wherein in a case in which a first left end point is located on the left of the front side of the test board, a first right end point is located on the right of the front side, a fourth left end point is located on the left of the rear side of the test board, a fourth right end point is located on the right of the rear side, a line connecting the first left end point and the fourth right end point is referred to as a first virtual line, a line connecting the first right end point and the fourth left end point is referred to as a second virtual line, a point where the first virtual line and the second virtual line intersect is called a center point, and a virtual line connecting the center point and a center point of the rear side is defined as a third virtual line, and
in a case in which an area surrounded by the front side, the first virtual line, the center point, and the second virtual line is referred to as a first zone, an area surrounded by the left side, the first virtual line, the center point, and the fourth virtual line is referred to as a second zone, and an area surrounded by the right side, the second virtual line, the center point, and the fourth virtual line is defined as a third zone,
the plurality of semiconductor chips mounted in the first zone are tested by the first main board, the plurality of semiconductor chips mounted in the second zone are tested by the second main board, and the plurality of semiconductor chips mounted in the third zone are tested by the third main board.

6. The burn-in system according to claim 4, wherein in a case in which a first left end point is located on the left of the front side of the test board, a first right end point is located on the right of the front side, a fourth left end point is located on the left of the rear side of the test board, and a fourth right end point is located on the right of the rear side, a line connecting the first left end point and the fourth right end point is referred to as a first virtual line, a line connecting the first right end point and the fourth left end point is referred to as a second virtual line, a point where the first virtual line and the second virtual line intersect is defined as a center point, and
in a case in which an area surrounded by the front side, the first virtual line, the center point, and the second virtual line is referred to as a first zone, an area surrounded by the left side, the first virtual line, the center point, and the second virtual line is referred to as a second zone, an area surrounded by the right side, the first virtual line, the center point, and the second virtual line is defined as a third zone, and an area surrounded by the back side, the first virtual line, the center point, and the second virtual line is defined as a fourth zone, the plurality of semiconductor chips mounted in the first zone are tested on the first main board, the plurality of semiconductor chips mounted in the second zone are tested on the second main board, the plurality of semiconductor chips mounted in the third zone are tested on the third main board, and the plurality of semiconductor chips mounted in the fourth zone are tested on the fourth main board.

7. The burn-in system according to claim 3, wherein the second socket and the second main board arranged on the second wall surface are arranged to be movable, and the third socket and the third main board arranged on the third wall surface are arranged to be movable, wherein when the test board is put into the test chamber, the second socket and the third socket move towards the test board, so the second socket docks with the second plug and the third socket docks with the third plug.

\* \* \* \* \*